United States Patent

Genov et al.

[11] Patent Number: 6,142,722
[45] Date of Patent: Nov. 7, 2000

[54] AUTOMATED OPENING AND CLOSING OF ULTRA CLEAN STORAGE CONTAINERS

[75] Inventors: Genco Genov, deceased, late of San Jose, by Mila Genov, legal representative; Roumen G. Botev; Alexander D. Todorov, both of Sunnyvale, all of Calif.

[73] Assignee: Genmark Automation, Inc., Sunnyvale, Calif.

[21] Appl. No.: 09/098,349

[22] Filed: Jun. 17, 1998

[51] Int. Cl.[7] .................................................. B65G 49/07
[52] U.S. Cl. .................... 414/217; 414/226.01; 414/411; 414/416; 414/937; 483/901
[58] Field of Search ............................... 414/217, 222.07, 414/222.13, 225.01, 226.01, 292, 411, 416, 744.3, 744.5, 744.7, 937; 483/901; 294/2, 86.4, 902; 901/17, 30, 41

[56] References Cited

U.S. PATENT DOCUMENTS

| | | | |
|---|---|---|---|
| 4,222,699 | 9/1980 | Dunn et al. | 901/41 X |
| 4,619,572 | 10/1986 | Lorenzelli et al. | 414/217 |
| 4,635,328 | 1/1987 | Palmer | 901/42 X |
| 4,652,203 | 3/1987 | Nakashima et al. | 294/86.4 X |
| 4,793,053 | 12/1988 | Zuccaro et al. | 901/41 X |
| 5,007,784 | 4/1991 | Genov et al. | 414/937 X |
| 5,038,466 | 8/1991 | Marozsan et al. | 901/30 X |
| 5,044,063 | 9/1991 | Voellmer | 294/86.4 X |
| 5,256,128 | 10/1993 | Neumann | 294/86.4 X |
| 5,302,061 | 4/1994 | Terawaki et al. | 901/40 X |
| 5,364,219 | 11/1994 | Takahashi et al. | 414/217 |
| 5,586,585 | 12/1996 | Bonora et al. | 414/217 X |
| 5,607,276 | 3/1997 | Muka et al. | |
| 5,609,459 | 3/1997 | Muka | |
| 5,613,821 | 3/1997 | Muka et al. | |
| 5,628,683 | 5/1997 | Gentischer | 414/411 X |
| 5,664,925 | 9/1997 | Muka et al. | |
| 5,738,767 | 4/1998 | Coad et al. | 414/222.13 X |
| 5,772,386 | 6/1998 | Mages et al. | 414/411 |
| 5,803,979 | 9/1998 | Hine et al. | 414/225 X |
| 5,810,537 | 9/1998 | Briner et al. | 414/937 X |
| 5,870,886 | 2/1999 | Norton et al. | 414/292 X |
| 5,885,045 | 3/1999 | Rush | 414/226.01 X |
| 5,984,623 | 11/1999 | Smith et al. | 414/416 X |
| 6,024,526 | 2/2000 | Slocum et al. | 414/226.01 |

FOREIGN PATENT DOCUMENTS 228744 11/1988 European Pat. Off. ................. 901/41

*Primary Examiner*—James W. Keenan
*Attorney, Agent, or Firm*—Burns Doane Swecker & Mathis L.L.P.

[57] ABSTRACT

A substrate handling system is provided with a robot having the dual function of a removing and replacing substrate-containing pod doors and load lock chamber doors, and of transporting the substrates between the pods and various processing stations. The robot is equipped with an end effector having sockets into which interchangeable tools for implementing the various functions are removably mounted. The tools are retrieved from respective parking locations disposed within the system micro environment, and automatic interchangeability of the tools is facilitated by a novel socket mechanism which engages and disengages the tools to the robot arm without introducing contaminants into the micro environment.

28 Claims, 18 Drawing Sheets

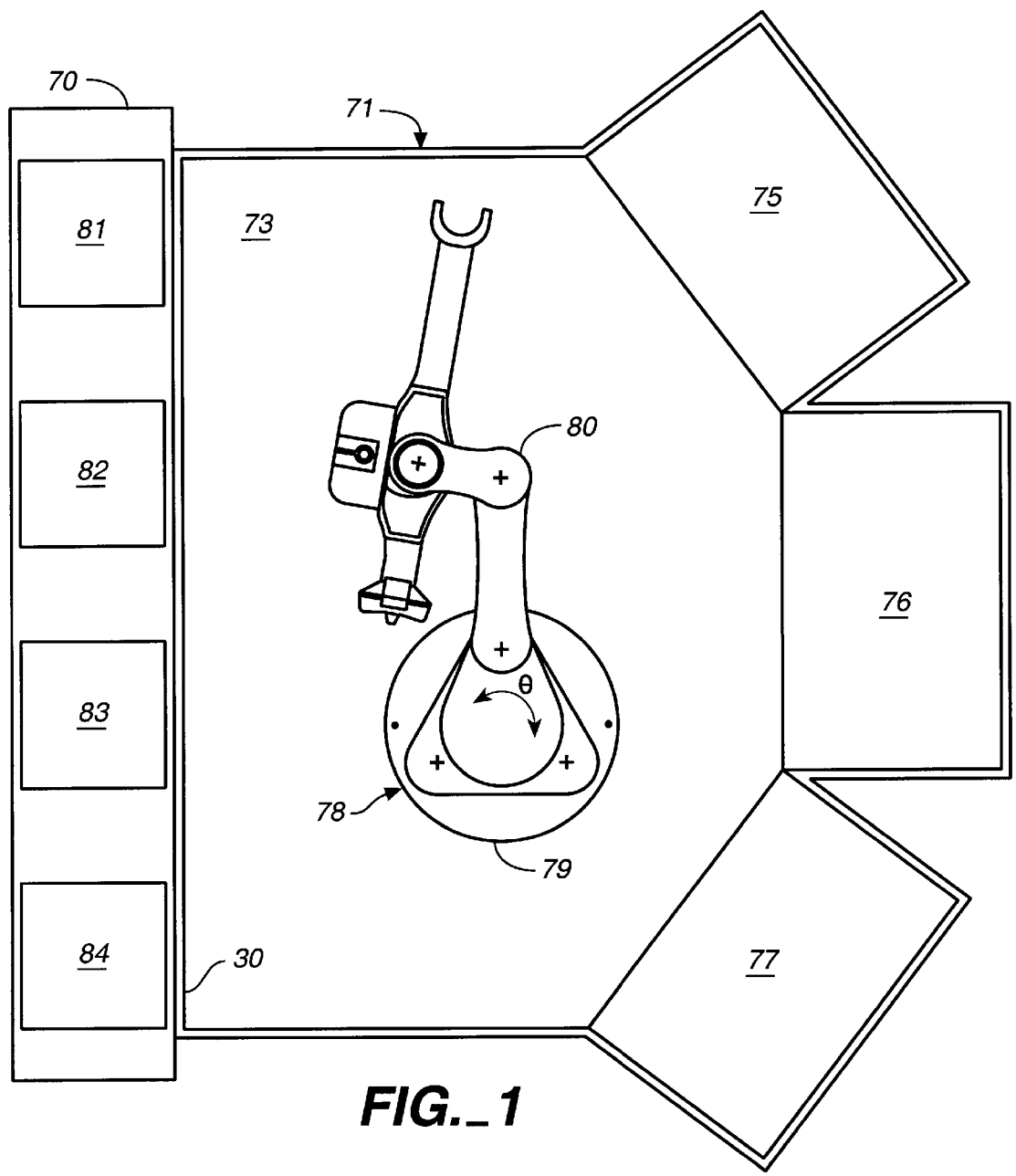
FIG._1

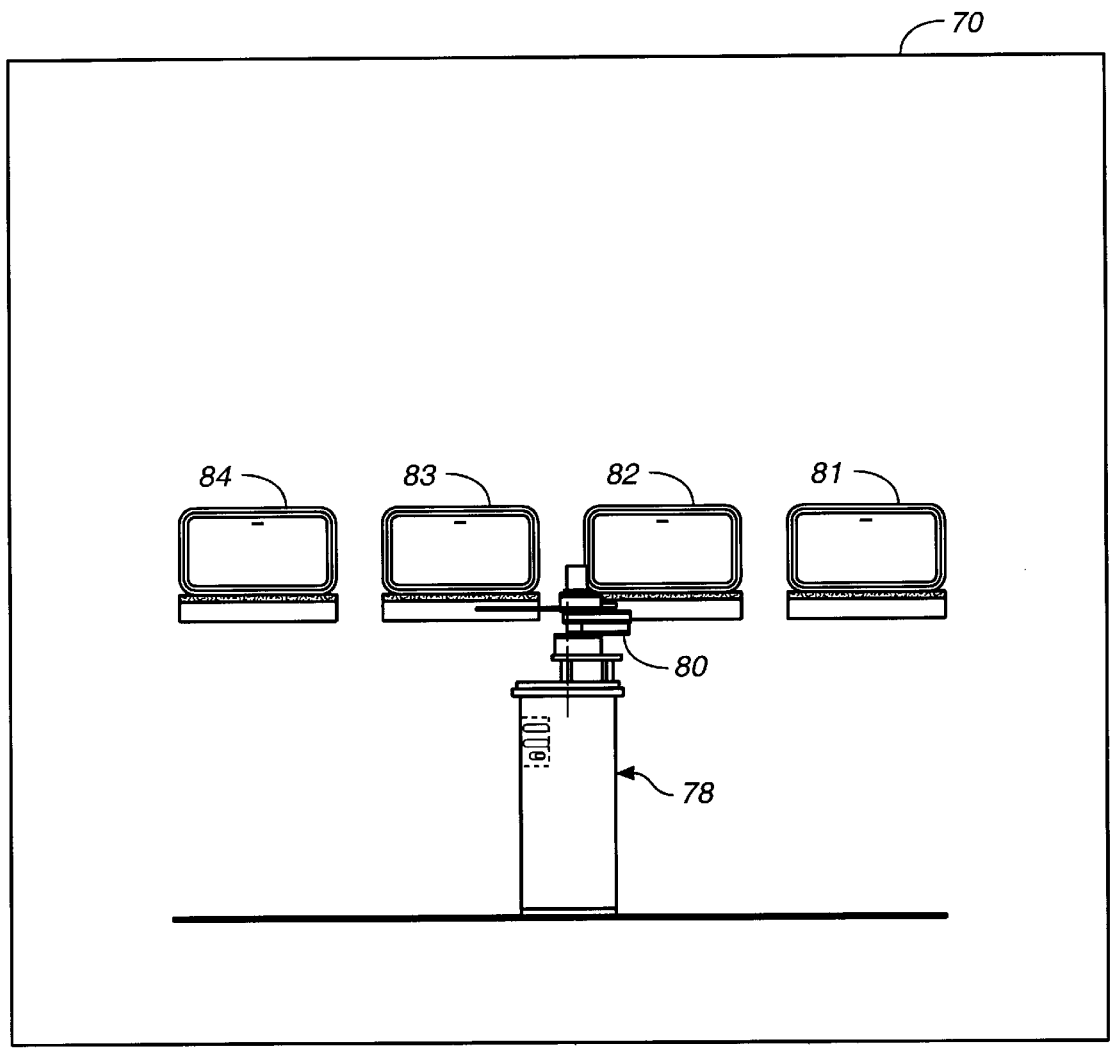
FIG._2

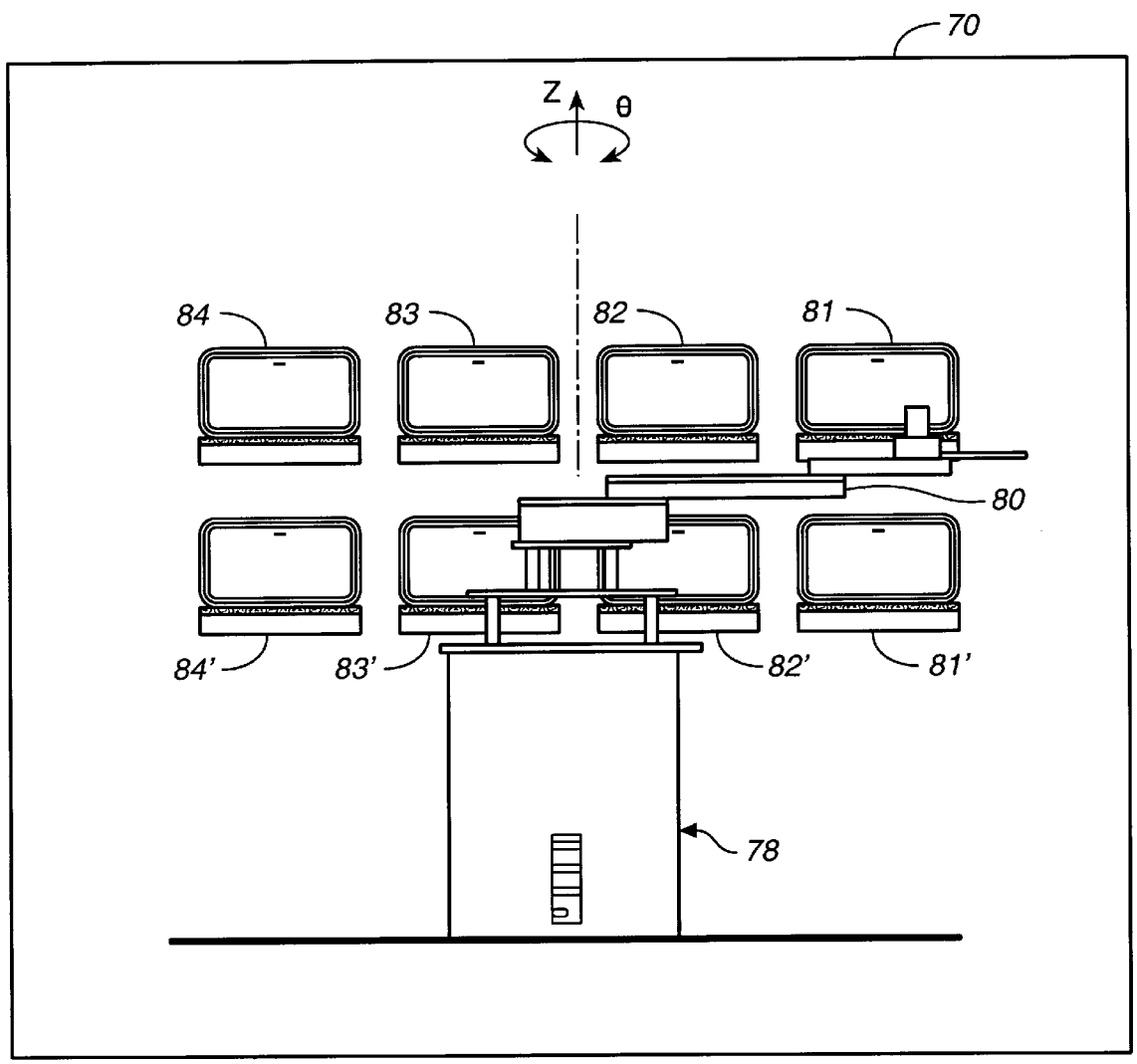
FIG._3

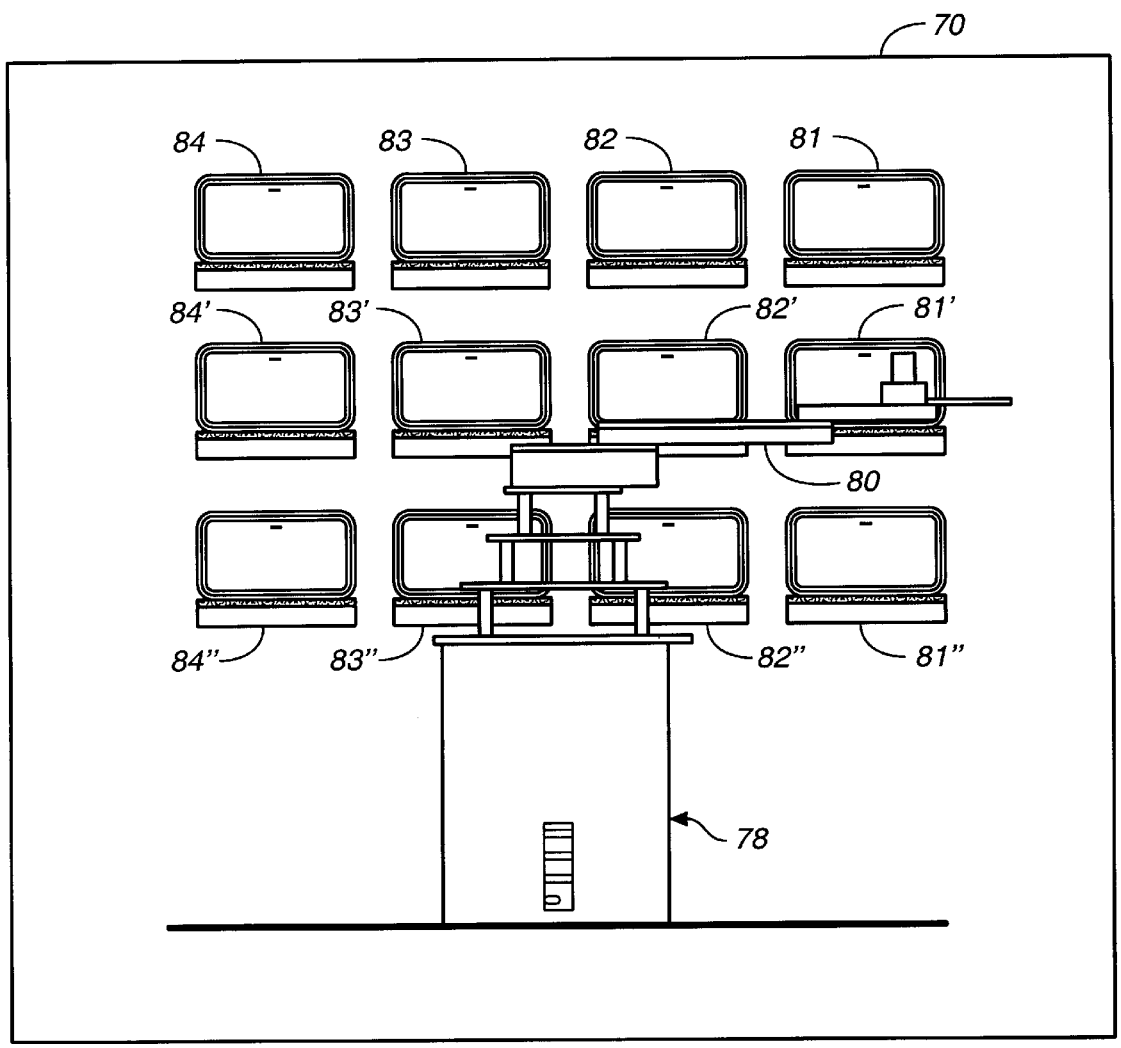
FIG._4

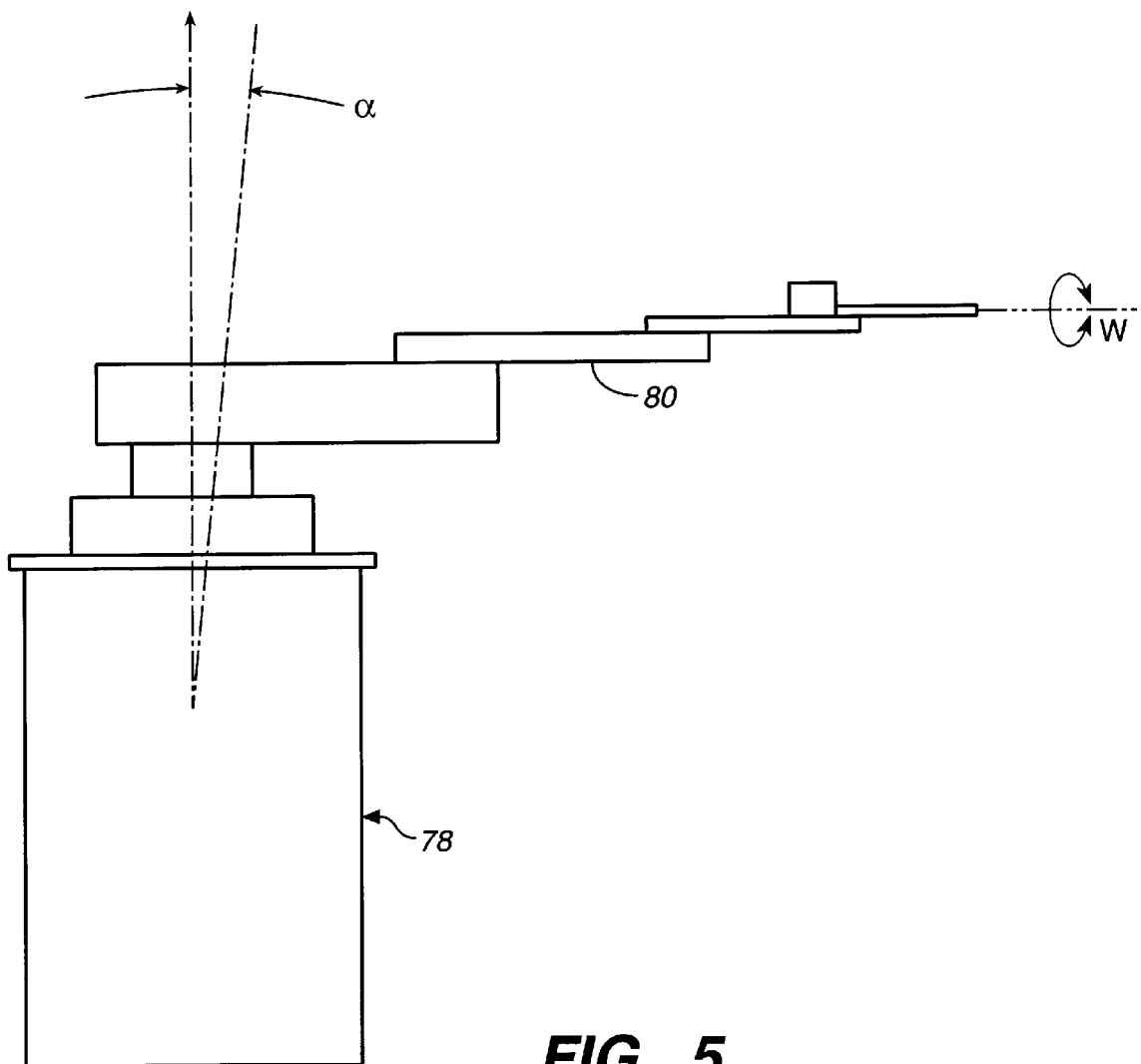
FIG._5
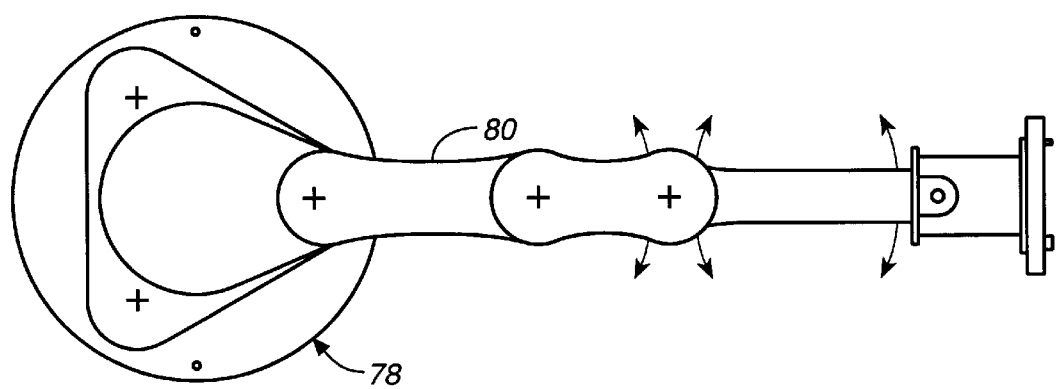
FIG._5B

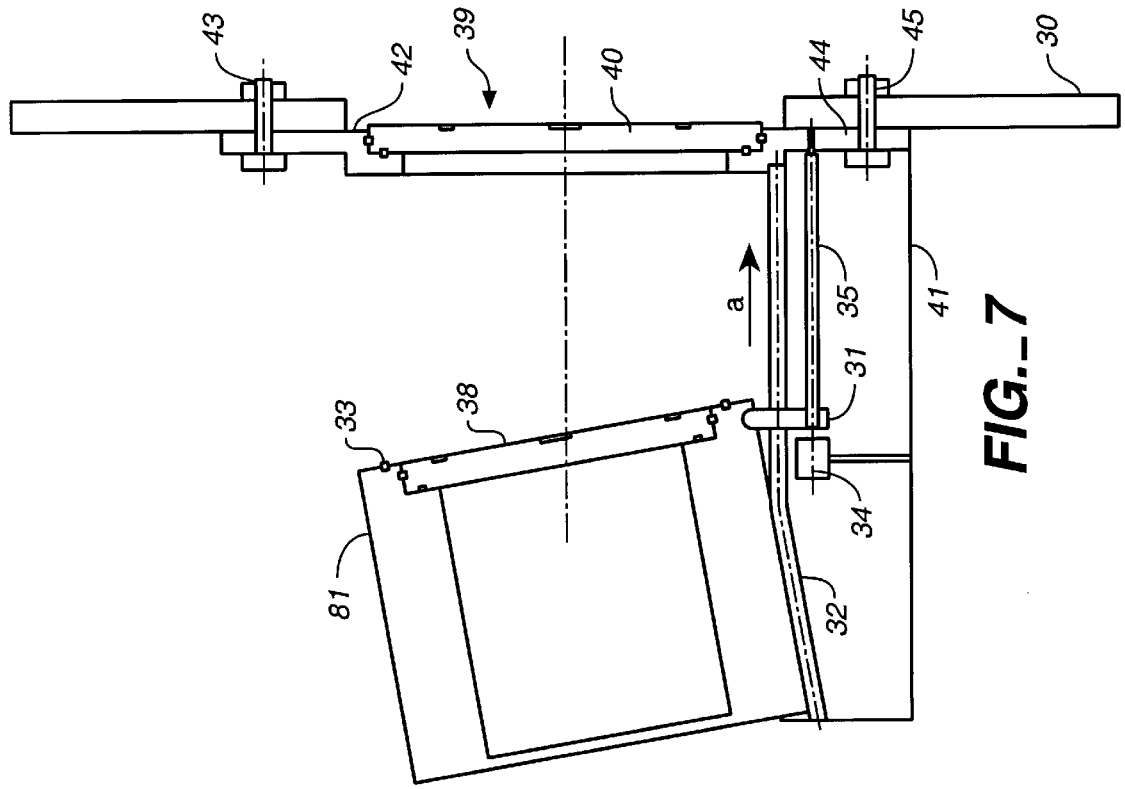
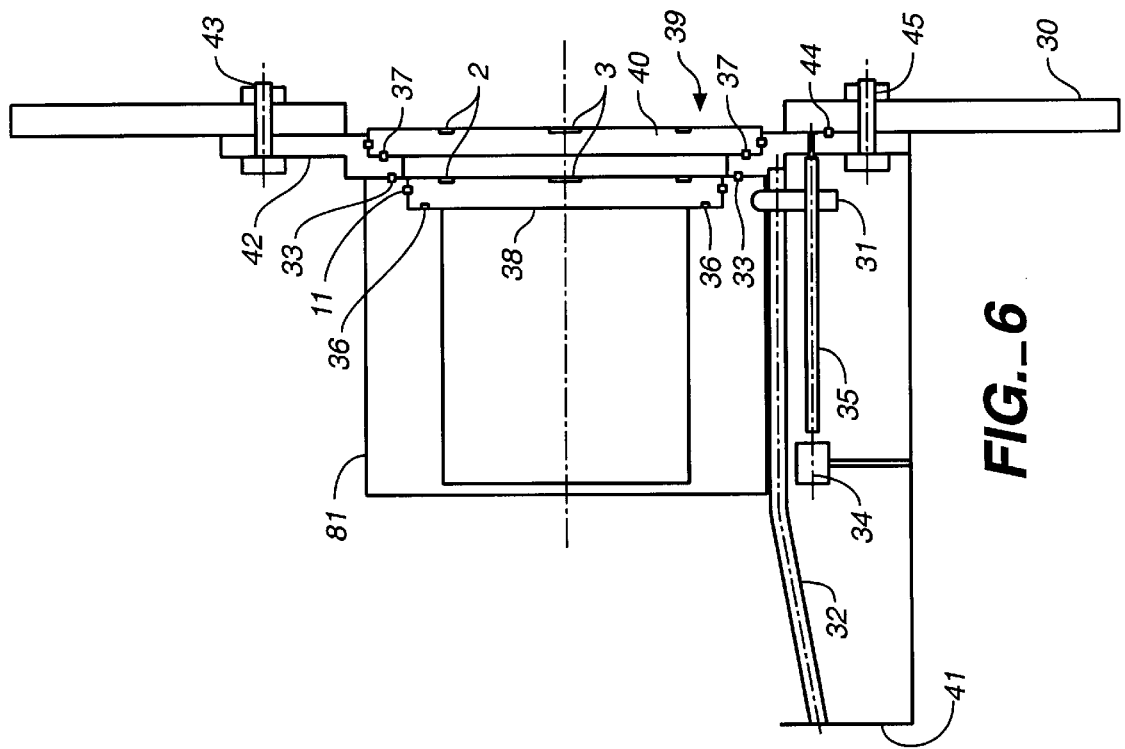

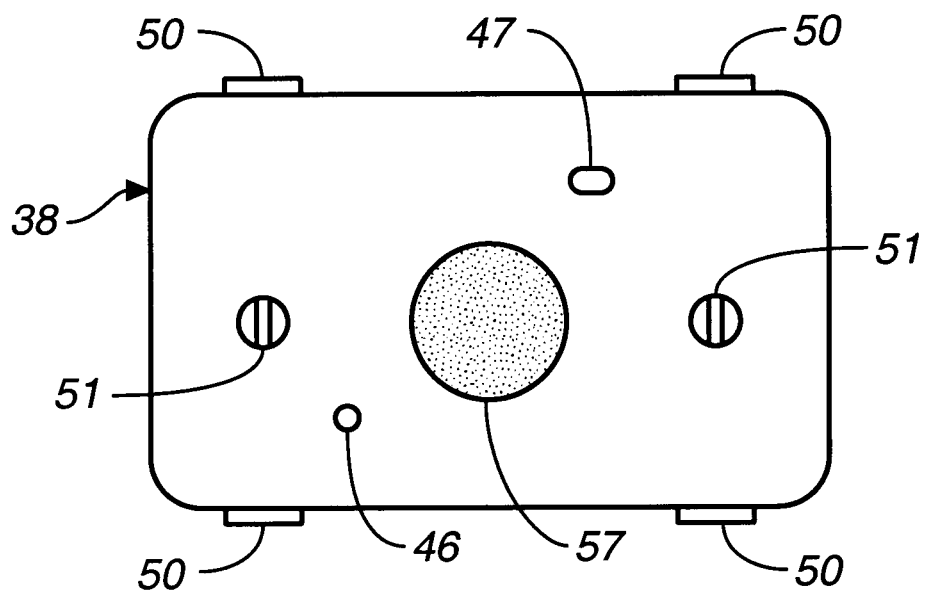
FIG._8A
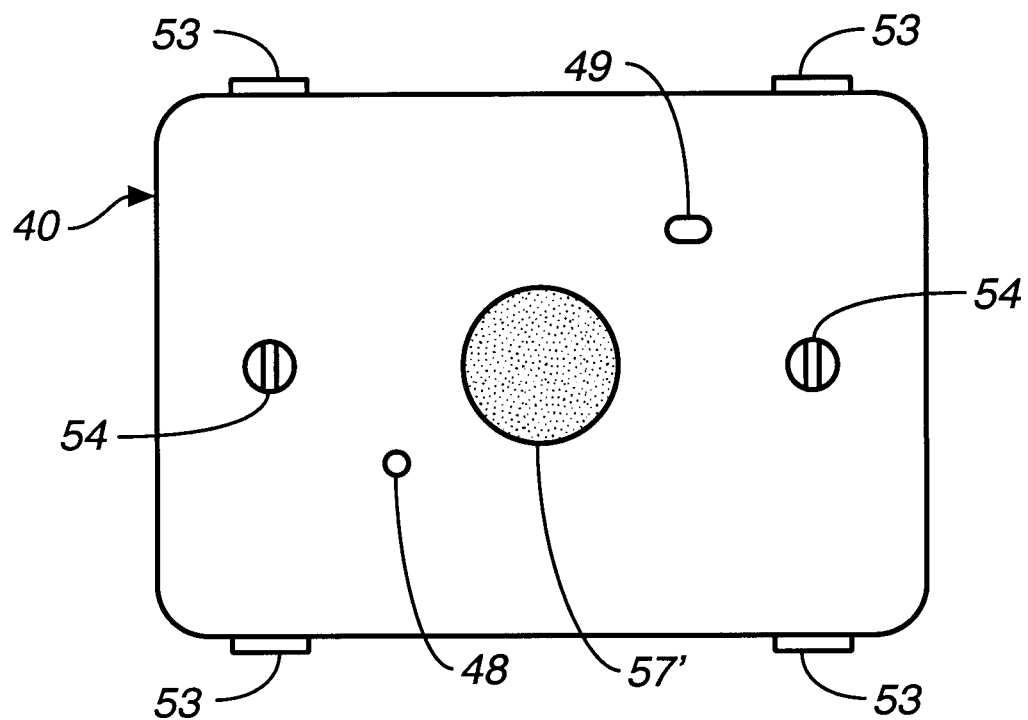
FIG._8B

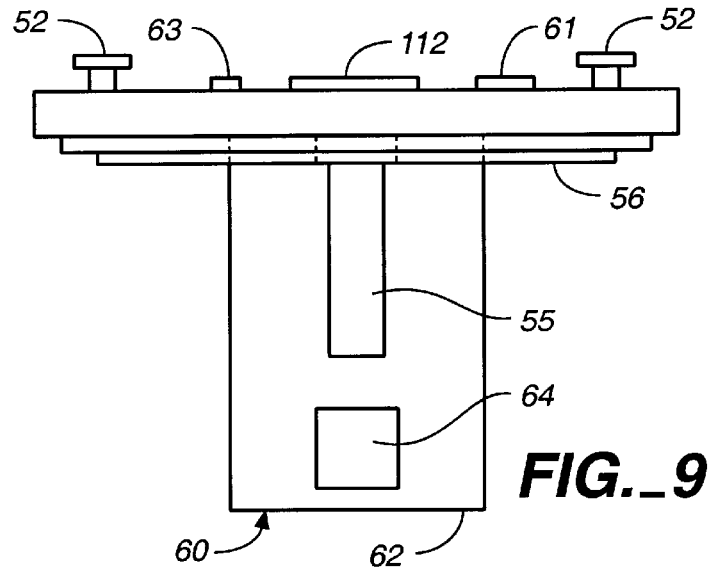
FIG._9
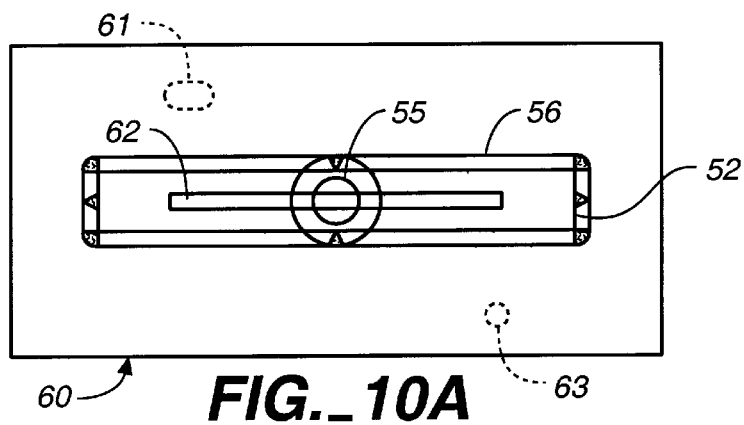
FIG._10A
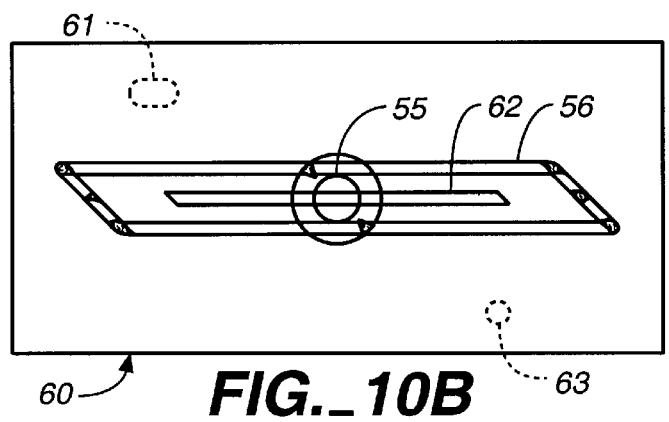
FIG._10B

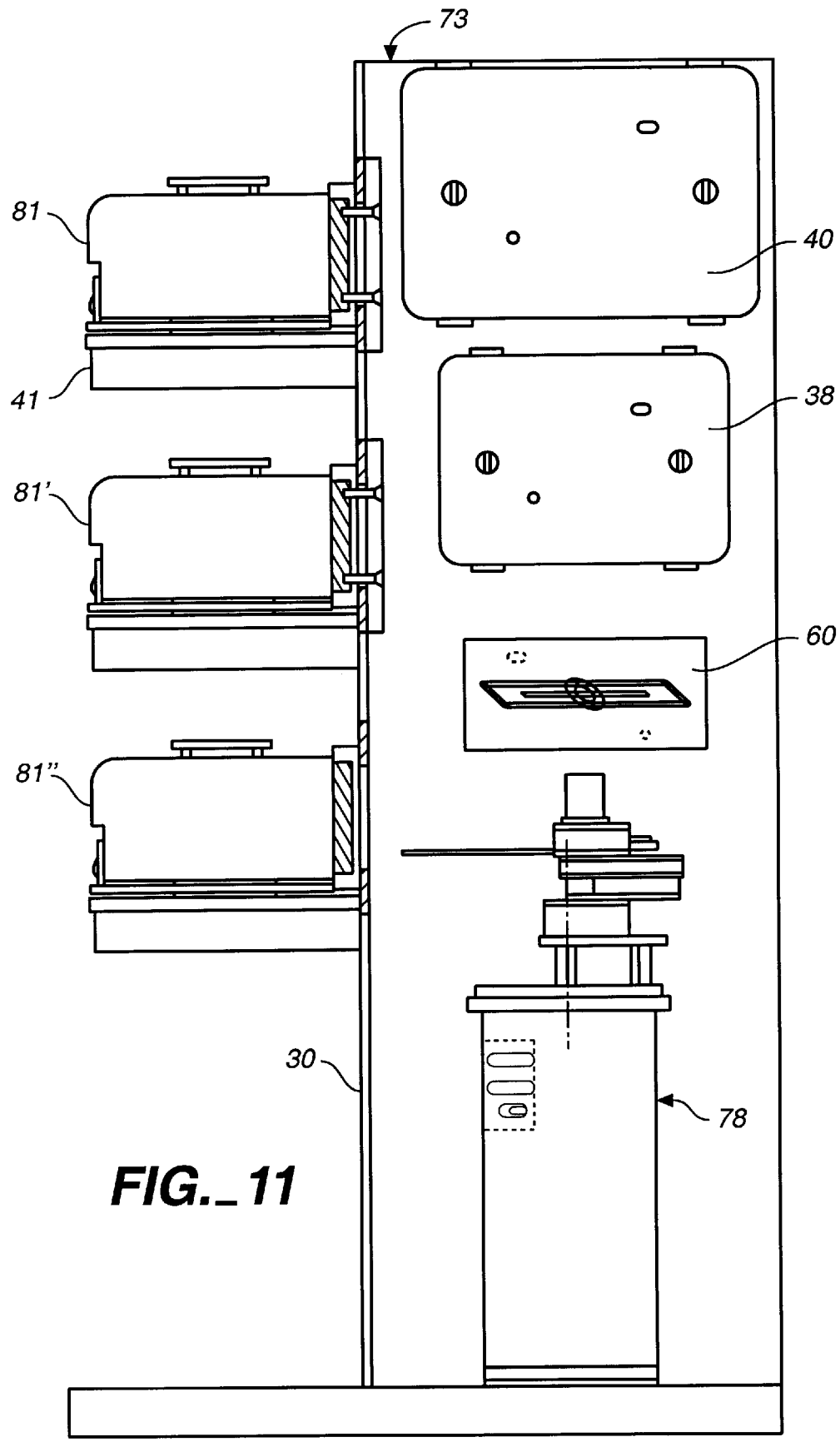
FIG._11

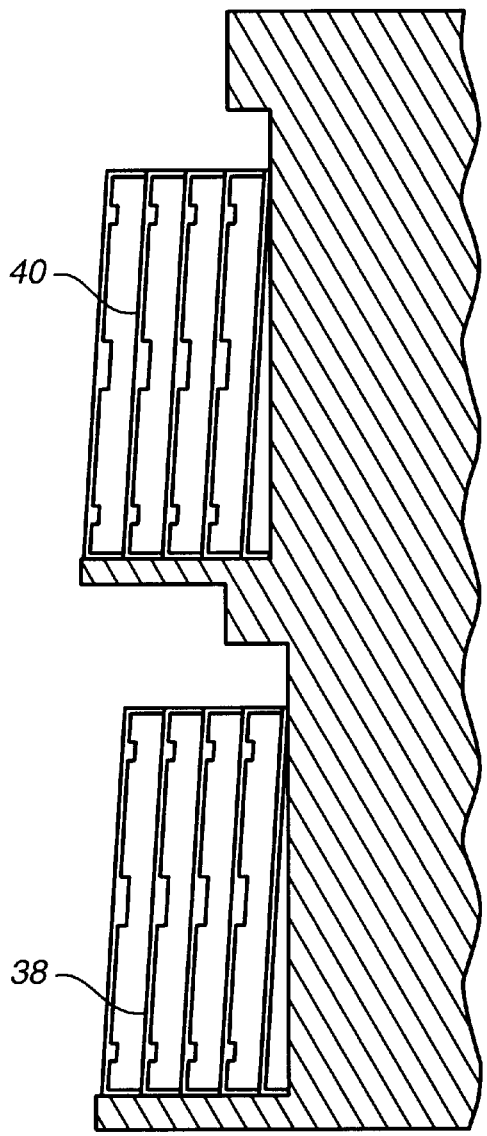
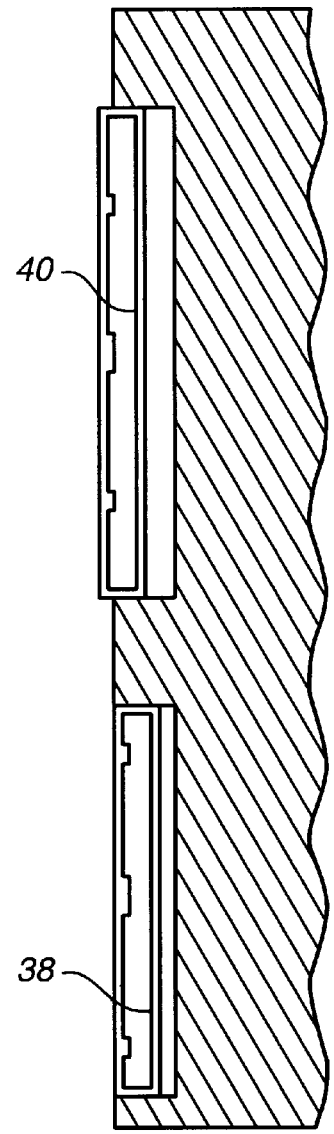
FIG._12A    FIG._12B

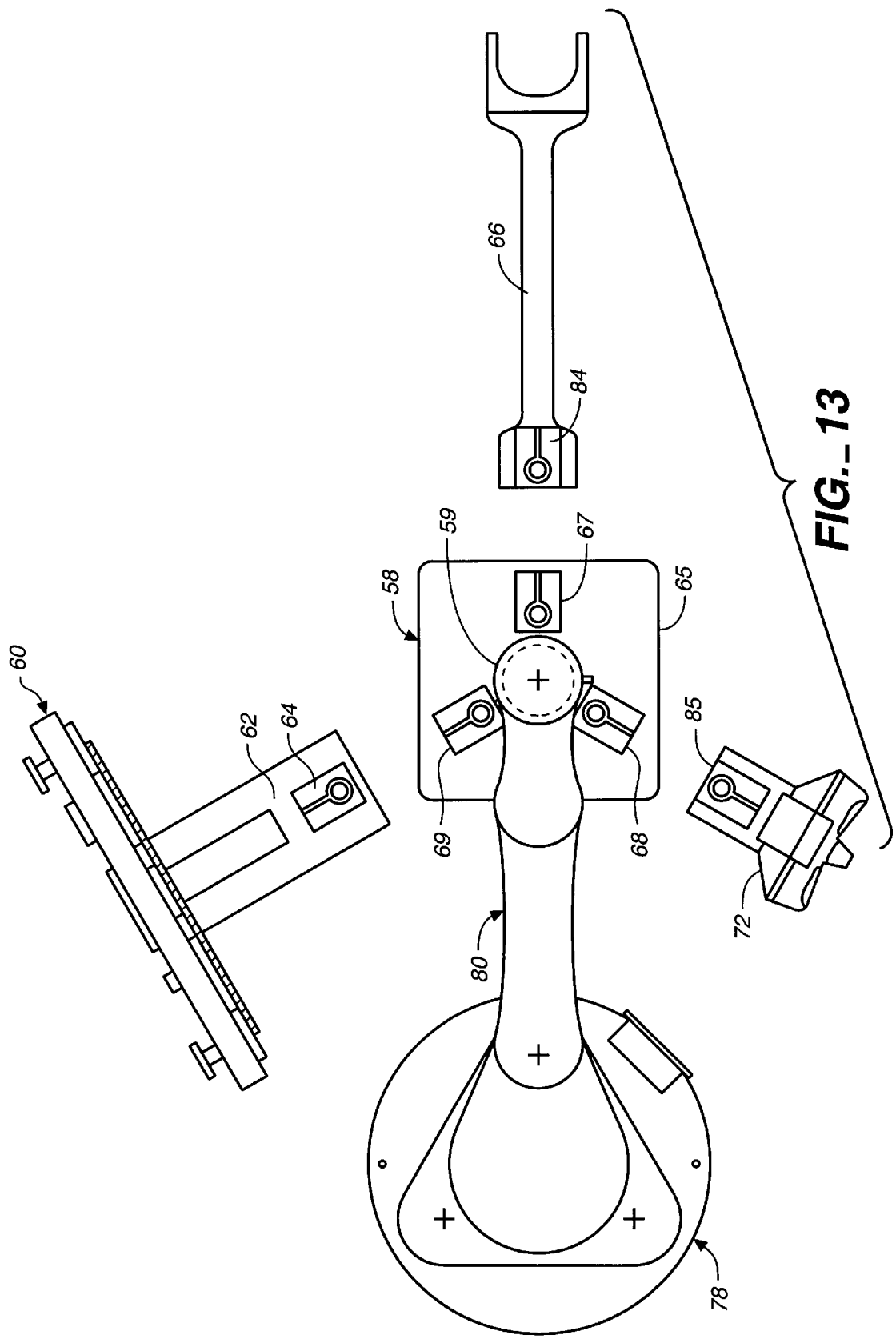

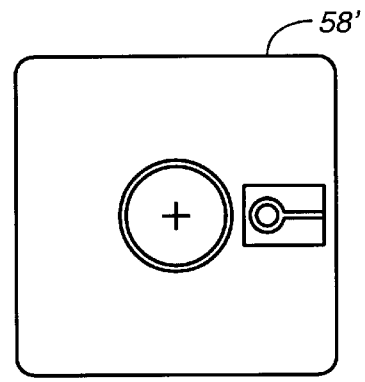
FIG._14A
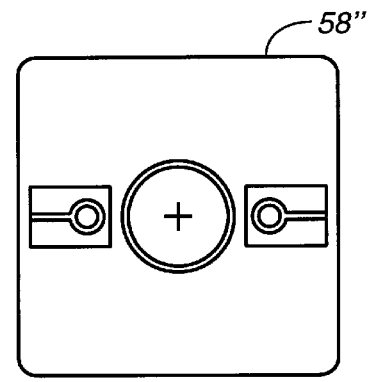
FIG._14B
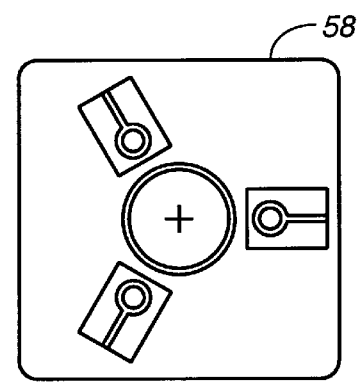
FIG._14C
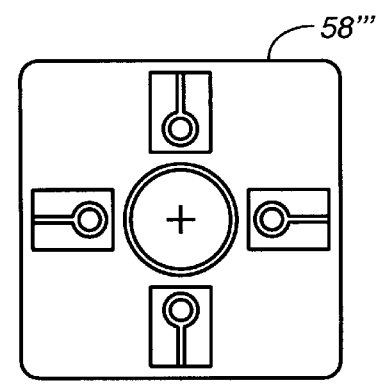
FIG._14D

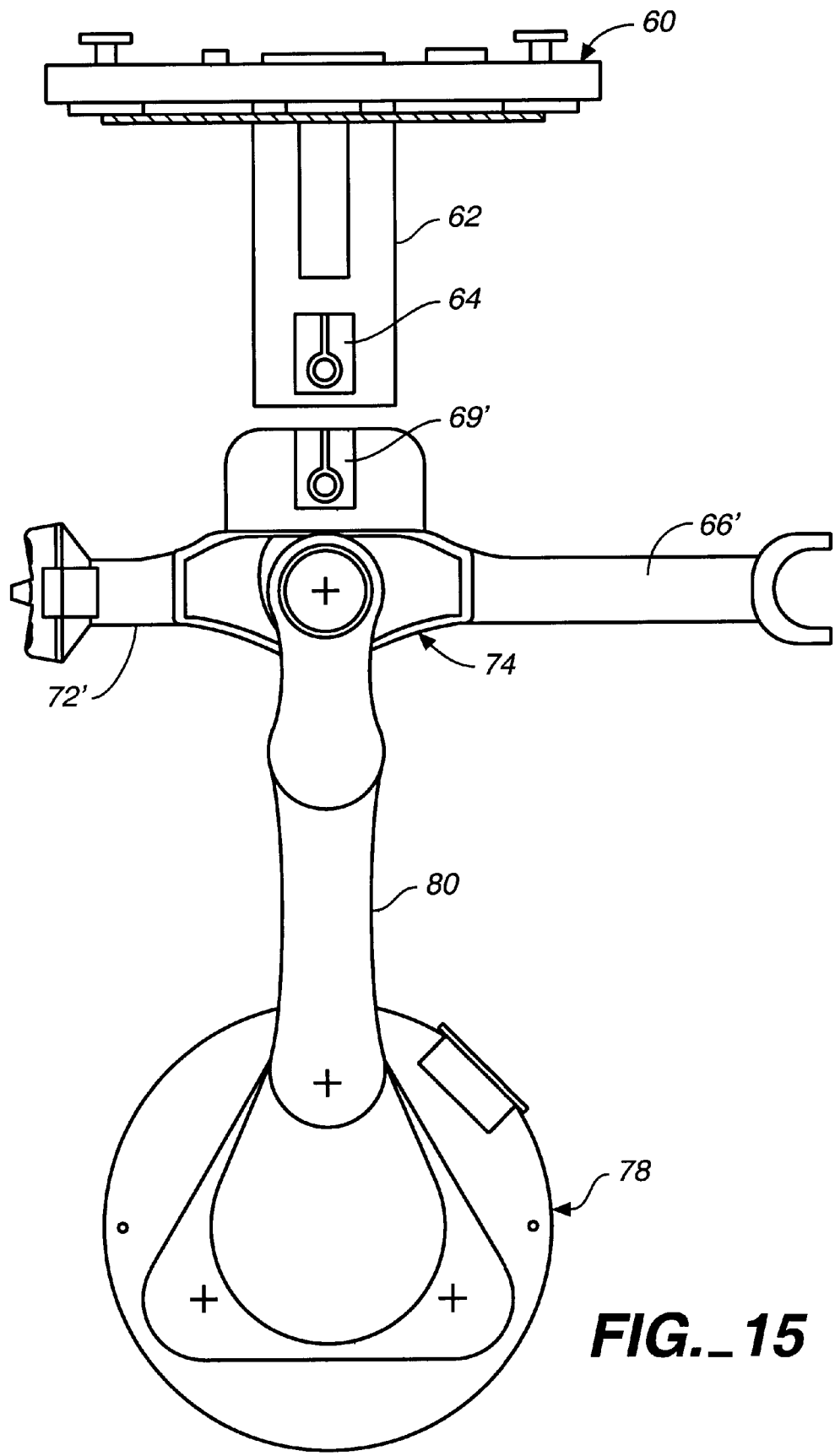
FIG._15

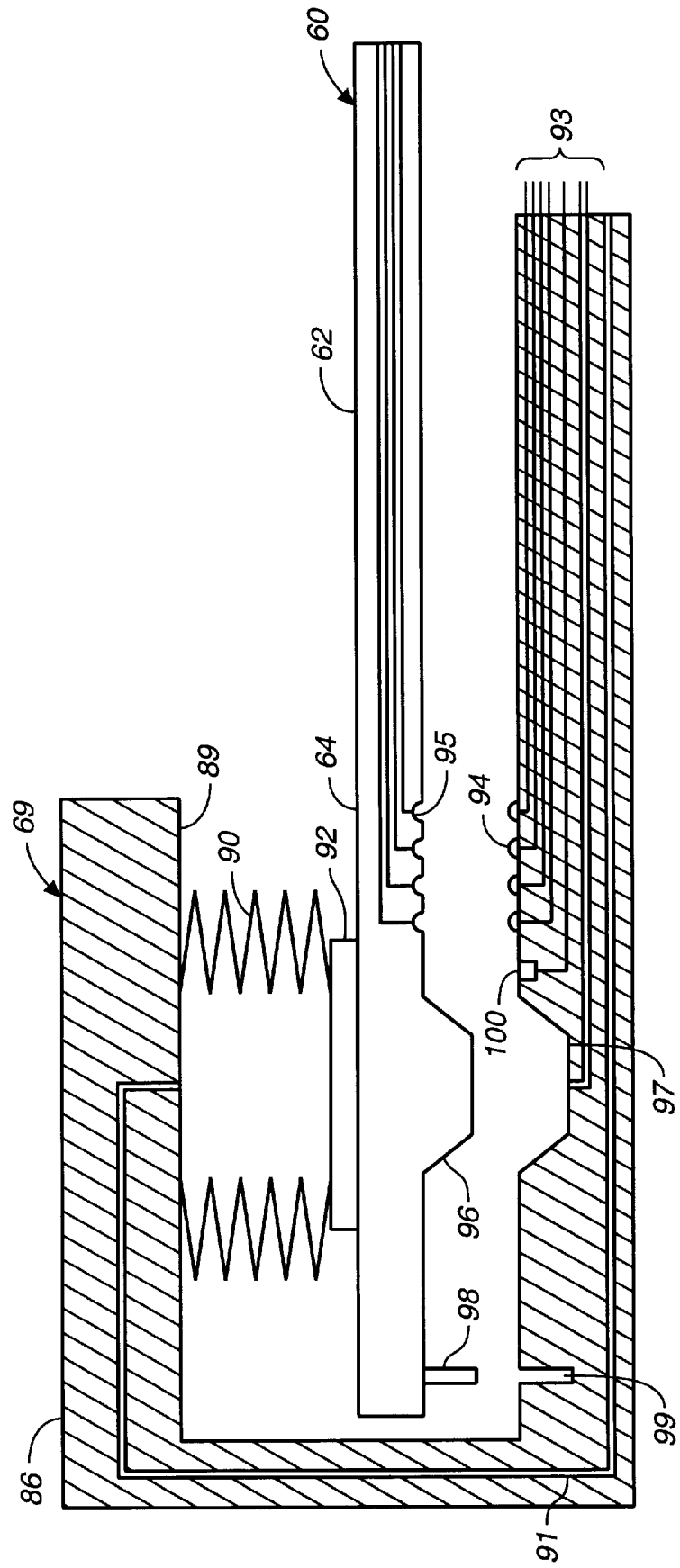

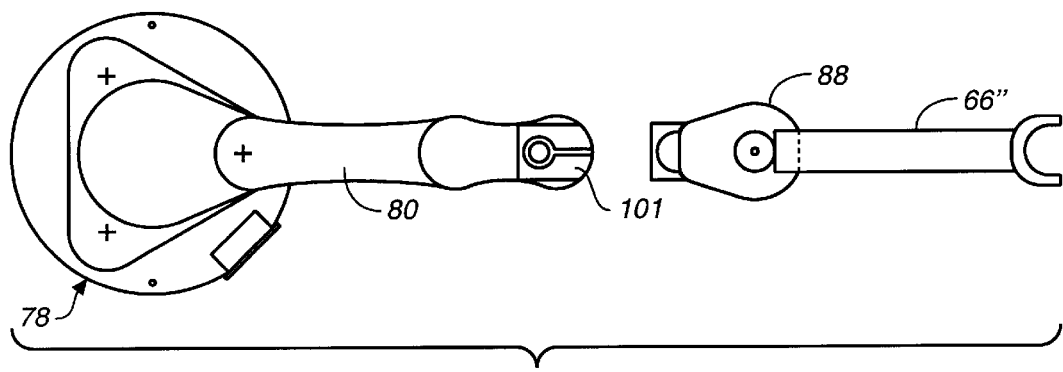
FIG._17A
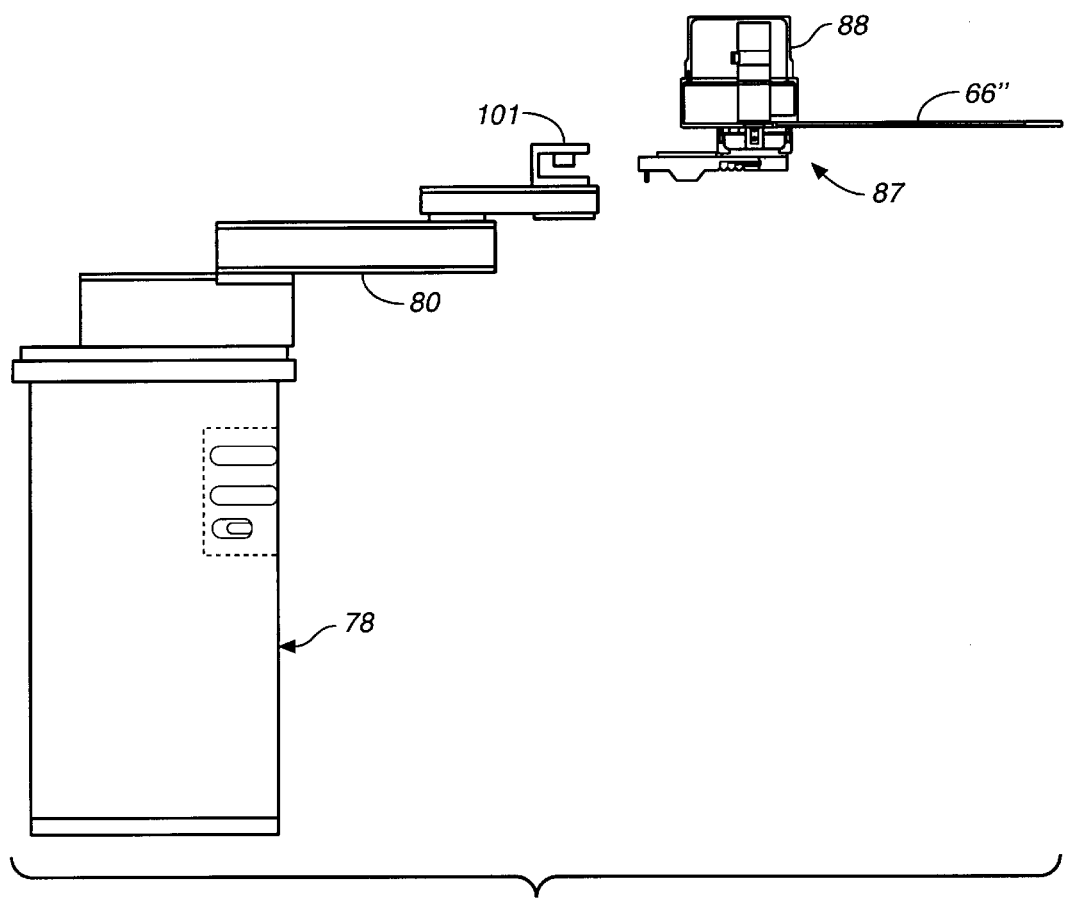
FIG._17B

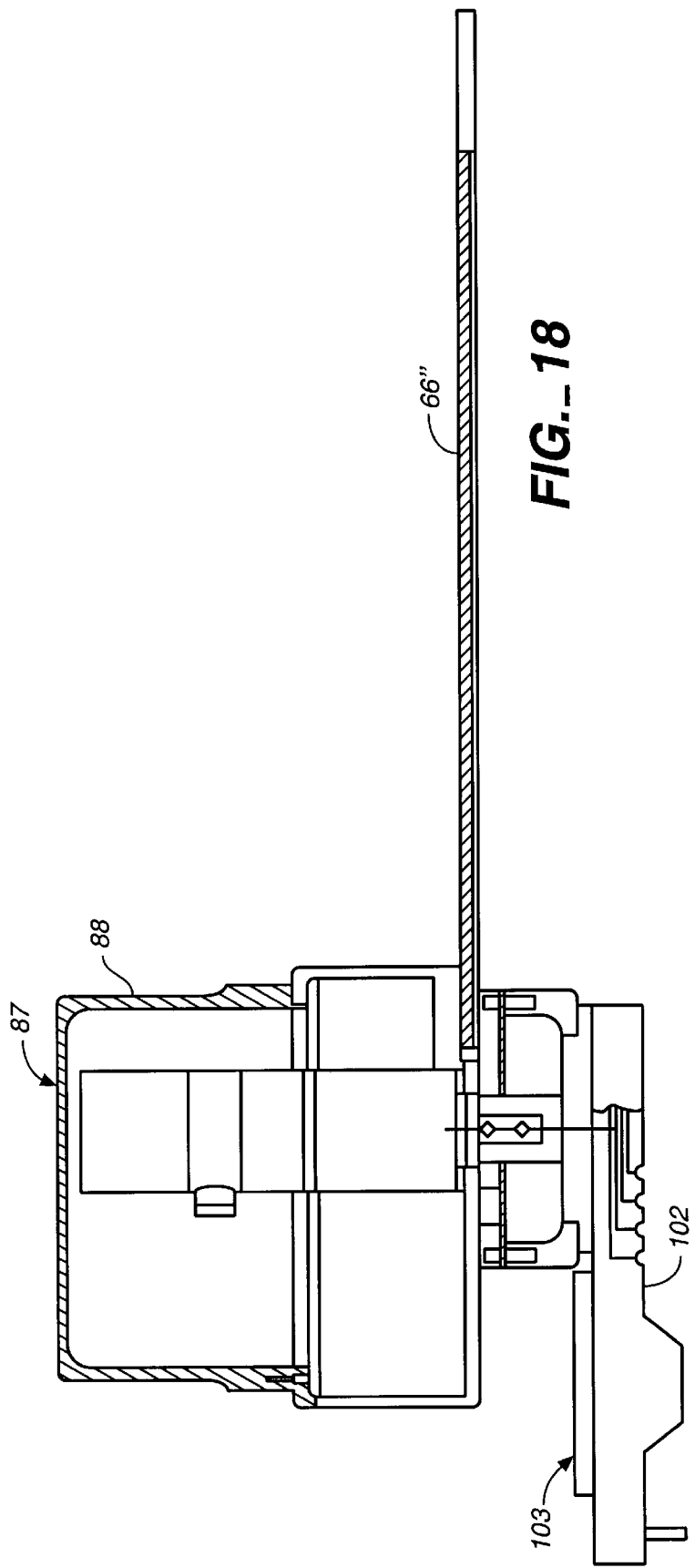
FIG._18

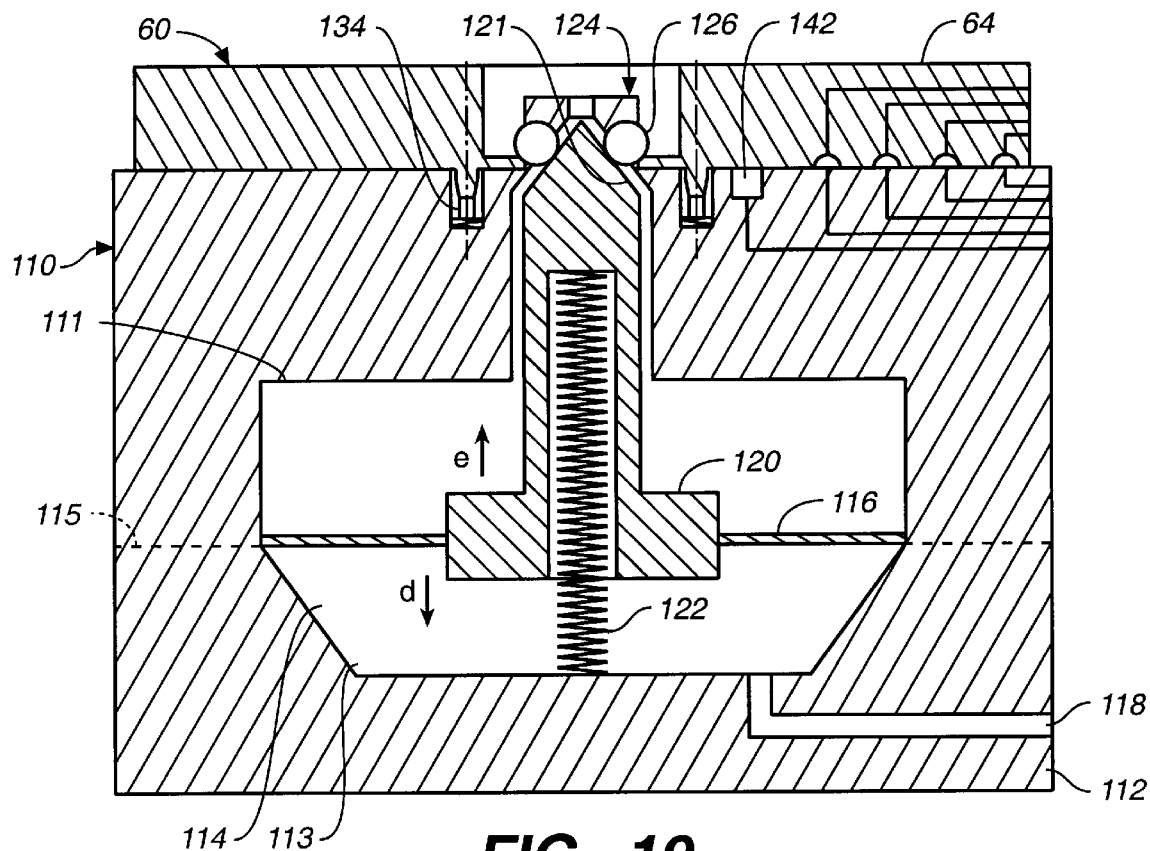
FIG._19
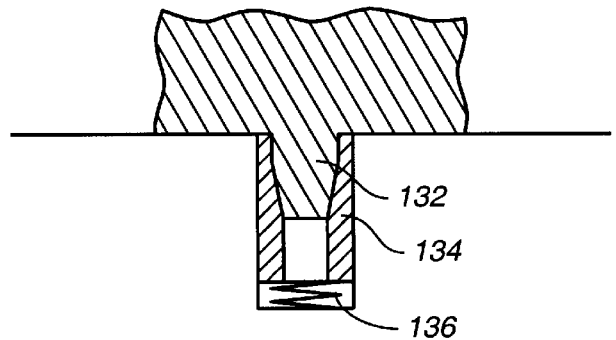
FIG._21

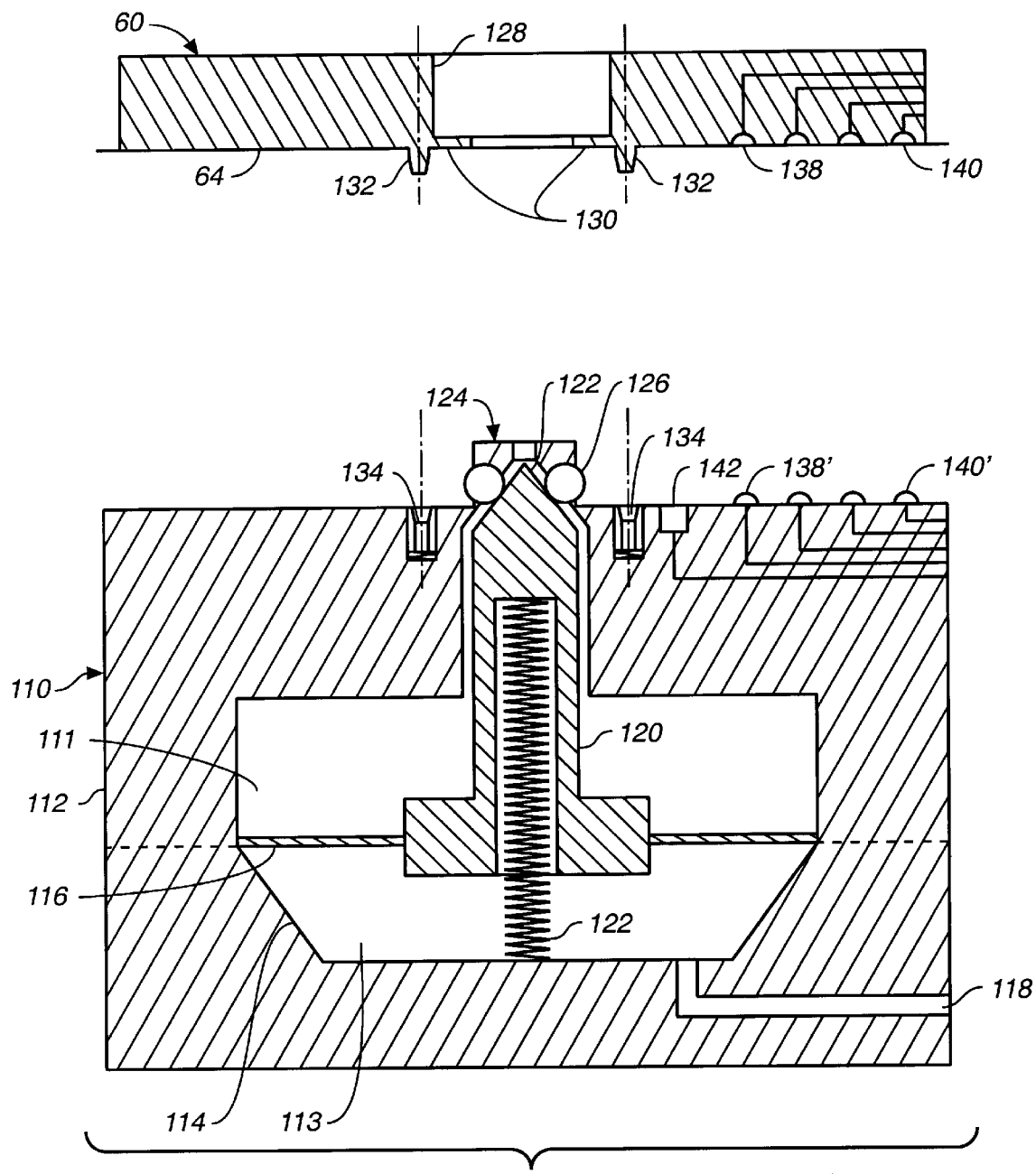
FIG._20

AUTOMATED OPENING AND CLOSING OF ULTRA CLEAN STORAGE CONTAINERS

BACKGROUND OF THE INVENTION

1. Field of the Invention

The invention relates to substrate handling systems, and more particularly, to systems for loading and unloading substrates into and from a processing environment.

2. Description of Related Art

Substrates such as semiconductor wafers are conventionally handled in protective containers which seal out contaminants prior to commencement of processing procedures. The processing procedures themselves are performed in a micro environment system having one or more processing stations into and out of which the wafers are transferred from the protective containers. The conditions in the micro environment system are carefully managed such that temperature and humidity are controlled, and use is made of air filtration systems which remove contaminants that would otherwise corrupt the delicate manufacturing procedures involved. Complex systems are used to effect these controls, and expedients used include establishing laminar flows within the micro environment to direct air flow towards the filtration devices.

Typically, a storage container comprises a pod containing a plurality of semiconductor wafers stacked in a cassette. When ready for processing, the pod containing the wafers is docked with an interface chamber, referred to as a load lock chamber, of the micro environment. The load lock chamber is provided with a port having a door supported therein. The door, normally closed to preserve the micro environment conditions, is opened when the pod is in the docked position. A door of the pod is also opened, thereby permitting transport of the semiconductor wafers between the pod and the micro environment through the load lock chamber.

Opening and closing of the pod and load lock chamber doors is automated. An opening mechanism provided in the load lock chamber simultaneously engages both doors, often sealing them together to sandwich contaminants therebetween, and removes them along a transport path to a remote position to thereby facilitate transfer of the wafers, by a different loading and unloading mechanism, between the pod and the load lock chamber. Prior art devices of this type include U.S. Pat. No. 5,607,276 to Muka, et al., U.S. Pat. No. 5,609,459 to Muka, U.S. Pat. No. 5,613,821 to Muka, et al., and U.S. Pat. No. 5,664,925 to Muka, et al.

Disadvantages attendant to the aforementioned prior art systems include the additional expense of the opening mechanism and the establishment of large exclusion zones which the opening mechanism and the transport path of the doors must necessarily occupy. Moreover, the complexity of the opening mechanism adds to operational expenses and increases the likelihood of system malfunction. Additionally, operation of the opening mechanism must be appropriately controlled and synchronized to the system as a whole, further complicating system operation and burdening system resources.

SUMMARY OF THE INVENTION

The present invention overcomes the deficiencies of the prior art by providing a system in which the same mechanism, namely the robot arm of a single robot, is used to remove and replace the pod and load lock chamber doors and to transfer the substrates between the pods and the various processing stations of the micro environment system.

The pod and load lock chamber doors are designed to interface with a door handling mechanism, in the form of a door gripping tool, fixed or removably mounted on the robot arm. In a first, fixed configuration, the door gripping tool is mounted on an end effector of the robot arm, which also supports a substrate handling tool for use after the doors have been removed. Alternatively, the door gripping tool and the substrate handling tool may be interchangeable components removably mountable on the robot arm. A combination of interchangeable and fixed tools can also be used.

In accordance with the interchangeable component embodiment of the invention, the robot arm self-attaches the door gripping tool, which is disposed within the micro environment, and uses the gripping tool to remove the load lock chamber doors and the pod doors. The robot arm then disengages the gripping tool and parks it at a suitable location, and self-attaches the substrate handling tool, also disposed in the micro environment, with which it proceeds to unload the substrates from the pods to the various processing stations, and then reloads the substrates into the pods after processing is complete. Finally, the arm parks the substrate handling tool, retrieves and re-attaches the parked gripping tool, with which it retrieves the pod and load lock chamber doors, and proceeds to close the pod and load lock chamber doors using the gripping tool.

The procedure in accordance with the invention is facilitated by the use of novel arrangements for attaching the various tools to an end effector of the robot arm, or for attaching the end effector itself to the robot arm. In the preferred embodiment, this arrangement relies on an outwardly expanding retaining mechanism to keep the detachable tools in place in a matching socket provided on the end effector or robot arm, and on vacuum action to release the retaining mechanism for detachment of the components. Use of vacuum action prevents introduction of contaminants into the micro environment system.

In an alternative embodiment, use is made of a sealed actuator comprising for example a self-contained bellows biasing member to retain the detachable tools in place in a matching socket provided on the end effector or robot arm. The sealed actuator is configured to seal in pressurized air, preventing its leakage into the micro environment.

In accordance with the invention, the robot is provided with two or more degrees of freedom, encompassing tiltability in the Z axis and yaw and roll motion of the robot arm. The Z axis tilting is tantamount to pitch motion of the robot arm. The range of motions permits accommodation of alignment errors of the doors, substrates and other components. Details of these expedients can be found in U.S. Pat. No. 5,789,890, assigned to the same assignee and incorporated herein by reference in its entirety.

One advantage of an arrangement in accordance with the invention is the economic savings associated with the elimination of the opening mechanism. Additionally, the overall system is simplified, thereby reducing operational costs and increasing throughput.

Another advantage of an arrangement in accordance with the invention is the ability to stack substrate-containing pods one above the other and/or in arrays comprising single or multiple rows and columns, with the robot being provided as a single- or multiple-stage device movable in the Z direction. This is possible because the space normally reserved for the opening mechanisms of the prior art is dispensed with, given the robot arm's novel dual function of opening and closing the doors in addition to transferring the substrates. The ability to thus arrange the pods for loading wafers into the micro environment system facilitates automation of the loading process in general, whereby additional automated mechanisms exterior of the micro environments can be used to manipulate pods between different micro environment systems and other remote locations for storage or additional processing. Production throughput can thus be significantly enhanced.

The ability to use multiple rows/columns in accordance with the invention permits interface of a significant number of pods, leading to the elimination of the so called "stacker" device (pod storage device), which is conventionally included in the configuration of wafer processing machines in fabs to store and sequentially load pods to a single or dual port environment, thus providing another obvious advantage to the system.

It is contemplated that the loading and unloading procedure can either be performed on an individual pod basis, wherein each pod is individually unloaded, the substrates therein processed, and then reloaded and closed, or it can be performed on a plural-pod basis, wherein groups of pods or all the pods are first opened, then their contents processed, then reloaded and closed. Combinations of such procedures can also be performed, depending on the particular application.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIG. 1 is a schematic top view of a substrate handling system in accordance with the invention;

FIG. 2 is a schematic front view of a four-pod, single row substrate handling system in accordance with the invention;

FIG. 3 is a schematic front view of an eight-pod, double row substrate handling system in accordance with the invention;

FIG. 4 is a schematic front view of an twelve-pod, triple row substrate handling system in accordance with the invention;

FIG. 5 is schematic view showing robot tilting (pitch) and axial rotation motions;

FIG. 5B is a schematic view showing robot yaw motion;

FIG. 6 is a schematic side view of a pod in the engagement position in accordance with the invention;

FIG. 7 is a schematic side view illustrating the operation of the pod latching mechanism in accordance with the invention;

FIGS. 8A and 8B are schematic front views of the pod and load lock chamber doors in accordance with the invention;

FIG. 9 is a schematic top view of the gripper tool in accordance with the invention;

FIGS. 10A and 10B are schematic back views of the gripper tool in accordance with the invention and in the unactuated and actuated positions;

FIG. 11 is a schematic view showing parking positions of the pod and load lock chamber doors and the gripper too in accordance with the invention;

FIGS. 12A and 12B are schematic views of the pod and load lock chamber doors in respective parking positions in accordance with the invention;

FIG. 13 is an exploded schematic view of an end effector and three interchangeable tools in accordance with the invention;

FIGS. 14A to 14D are schematic top views of four end effector arrangements in accordance with the invention;

FIG. 15 is a schematic top view of an end effector having a pair of fixed tools and a socket for an interchangeable tool in accordance with the invention;

FIG. 16 is a schematic top view of a socket in accordance with the invention;

FIGS. 17A and 17B are schematic views of a robot end effector arrangement in accordance with a second embodiment of the invention;

FIG. 18 is a schematic side view of the end effector of FIG. 17A;

FIG. 19 is a schematic view of a socket-tool arrangement in the engaged position in accordance with a preferred embodiment of the invention;

FIG. 20 is a schematic view of the socket-tool arrangement of FIG. 19 in the disengaged position; and FIG. 21 is a schematic view of an alignment guide pin and bushing of the socket-tool arrangement of FIG. 19.

DESCRIPTION OF THE PREFERRED EMBODIMENTS

In accordance with the invention, a robot having an articulating robot arm is disposed in a load lock chamber. The load lock chamber, itself maintained under controlled micro environment conditions, functions to interface various processing stations of a micro environment system, such as one used for processing of semiconductor wafers, with the exterior of the micro environment system. The robot serves to load and unload the wafers into the micro environment system by way of the load lock chamber, via ports in the load lock chamber which mate with containers, or pods, in which the wafers are stored during transport to and from the micro environment system. The robot also serves the function of opening and closing doors of the ports of the load lock chamber and of the pods, and of parking the doors at remote locations when the pods are being accessed.

FIG. 1 schematically shows a top view of an arrangement in accordance with the invention. A micro environment system 71 comprises a load lock chamber 73 and processing stations 75, 76 and 77. Load lock chamber 73 contains a robot 78 having an articulating robot arm 80, which is mounted for planar R- and θ-motion in a cylindrical coordinate system referenced off robot body 79. This motion provides two degrees of freedom and enables robot arm 80 to access locations radially disposed around robot 78, such as the locations of processing stations 75, 76 and 77. To access linearly-disposed pods 81–84, arm 80 is also provided with a third degree of freedom—namely, yaw motion as illustrated in FIG. 5B. Details of the motions contemplated for use in the present invention, which can encompass two or more degrees of freedom and may provide kinematic redundancy, are provided in U.S. patent application Ser. No. 08/788,898, assigned to the same assignee and incorporated herein by reference in its entirety.

A docking station 70 is provided for communication with the load lock chamber 73 of the micro environment system 71. The docking station 70 supports pods 81, 82, 83 and 84 each containing one or more substrates, such as semiconductor wafers (not shown) stacked therein. Robot 78 operates to transfer wafers from the pods 81–84 to any or all of the processing stations 75, 76 and 77 where any of a number of ensuing semiconductor wafer processing operations take place. Subsequently, robot 78 operates to return the wafers to the pods 81–84.

FIGS. 2, 3 and 4 schematically show front views of a docking station 70 in accordance with the invention. The docking station 70 can be designed to accommodate multiple rows of pods stacked above each other, each row containing for example four pods 81–84 in an engagement position with the load lock chamber 73. The pods are accessed by a robot arm 80 of robot 78. In the multiple row arrangement, robot 78 is provided with motion in the Z direction (vertical, as depicted in the drawing figures) thereby affording it a fourth degree of freedom. This motion may also be necessary in single-row arrangements where stacked wafers are accessed by the robot arm, or where the pickup and/or release stroke of the arm 80 requires such motion. The Z motion can be realized using a single stage robot platform, or using multiple stages described in the aforementioned U.S. patent application Ser. No. 08/788,898. Moreover, in order to accommodate misalignments of for example the pods 81–84 with respect to the robot arm 80, the robot 78 or any combination of components thereof, including the robot arm 80, may be designed to be tiltable to thereby afford additional degrees of freedom. Tilting with respect to the Z-axis is shown by the angle α in FIG. 5 and is tantamount to pitch motion of the arm 80. Axial rotation, or roll, of segments of the arm 80 is also contemplated, as shown by the angle ω depicted in FIG. 5, along with the yaw motion discussed above, to thereby afford robot arm 80 up to six degrees of freedom. Again it should be noted that the invention is not limited to six degrees of freedom as more degrees of freedom can be added, even to the point of kinematic redundancy, depending on the particular application.

FIG. 6 schematically shows a side view of a pod 81 in the engagement position in the docking station. In this position, pod 81 is urged towards frame or wall 30 of the load lock chamber 73, and is sealed against frame 42 by a seal 33, which may be mounted on pod 81. Pod door 38 is in a confronting relationship with load lock chamber door 40, which is supported in port 39 of load lock chamber 73 by the frame 42. The pod is locked against frame 42 and is sealed thereagainst by a seal 33. A seal 36 is provided to isolate the environment within pod 81 when pod door 38 is closed, while a seal 37 is provided to isolate the micro environment of load lock chamber 73 when load lock chamber door 40 is closed.

Pod 81 is loaded into the engagement position and urged into place by a latching mechanism comprised of nut 31 driven in slot 32 by motor 34 and lead screw 35. The latching mechanism is disposed in support base 41 mounted against wall 30 using appropriate fastening means 45 and having a seal 44. Operation of the latching mechanism is best illustrated in FIG. 7, wherein nut 31 is shown engaging a portion of pod 81 and pulling the pod 81 towards port 39 (arrow a), which comprises generally a frame 42 mounted in wall 30 using appropriate fastening means 43. It will be appreciated that other latching mechanisms, along with crank, cam or other mechanical linkages, may be used without inventive departure from the spirit and scope of the present invention.

FIG. 8 shows a schematic frontal view of pod door 38 and load lock chamber door 40. Pod door 38 is provided with latches 50 for retaining the pod door 38 in pod 81. Latches 50 are retractable into the pod door 38 to thereby permit disengagement and removal of pod door 38 from the pod 81 and afford access to the interior of the pod 81. The retraction of latches 50 is effected by operation of a mechanical linkage (not shown) provided with pod door 38 which links motion, preferably rotation, of lock sockets 51 provided in pod door 38 to motion of latches 50.

In an analogous manner, load lock chamber door 40 is provided with latches 53 mechanically linked to lock sockets 54. Again, rotation or other motion of lock sockets 54 operates to retract latches 53 to permit removal of door 40 from frame 42 of port 39. Of course, other mechanisms for retaining and disengaging the pod and load lock chamber doors 38 and 40 would fall within the purview of the invention. For example, rather than have a pair of lock sockets (51,54) per door, the latches (50,53) of each door may each be controlled by a single lock socket.

In accordance with the invention, actual removal and replacement of doors 38 and 40 is effected by the robot 78. To accomplish this, arm 80, which is designed to support interchangeable tools as discussed below, is equipped with gripper tool 60 shown in FIGS. 9 and 10. Gripper tool 60 is provided with a mounting portion 62 for engaging robot arm 80. As detailed below, mounting portion 62 is provided with a unit interface 64 which insures proper mating and control of gripper tool 60 by robot 78. Additionally, gripper tool 60 is provided with guiding pins and surfaces 61 and 63, respectively, designed to mate with corresponding features such as recesses 46 and 47 provided in pod door 38 and recesses 48 and 49 provided in load lock chamber door 40 in order to facilitate alignment of the components.

Gripper tool 60 is further provided with keys 52 which engage pod door lock sockets 51 and load lock chamber door lock sockets 54. Keys 52 are actuated by a motor 55 mounted in mounting portion 62 via mechanical linkage 56. In an alternative embodiment, mechanical linkage 56 may be mounted within a protective cover (not shown) such that its components are concealed from view. Also alternatively, motor 55 on gripper tool 60 can be dispensed with altogether, and the mechanical motion necessary for actuation of keys 52 can be delivered through a mechanical shaft or clutch arrangement (not shown) which is detachably connectable between gripper tool 60 and robot arm 80, or by pneumatic means or by means of a magnetic field.

Load lock chamber door and pod door removal and replacement operations are effected in the following manner. For load lock chamber door engagement, robot arm 80, actuated by robot 78 and having gripper tool 60 mounted to a distal end thereof, maneuvers gripper tool 60 into alignment with the load lock chamber port 39 corresponding to any one of the pods of the pod array disposed in docking station 70. Gripper tool 60 is then engaged with the load lock chamber door 40 of the port 39 such that keys 52 of gripper tool 60 mate with lock sockets 54 of load lock chamber door 40, facilitated by guiding pins and surfaces 61 and 63 corresponding to recesses 48. Upon successful engagement, motor 55 and linkage 56 actuate retraction of latches 53, thereby releasing door 40 from frame 42 in load lock chamber port 39. The pod door engagement operation is effected in a similar manner, and to facilitate this, the relative configurations of the features of the load lock chamber door 40 and the pod door 38 involved in the engagement of the gripper tool 60 with the doors are "standardized" with respect to the gripper tool 60 such that gripper tool 60 can be used with both doors. Of course, this does not mandate that the load lock chamber doors 40 be identical to the pod doors 38 in either size or construction, so long as the apparatus involved in the mating with gripper tool 60 match the features of the gripper tool.

It is also contemplated that the pod door 38 and the load lock chamber door 40 may be removed together, such that a simple mechanical means (not shown) can link the opening and transport operations performed by robot arm 80, causing both doors to be unlatched simultaneously and removed together. The doors 38 and 40 would be kept together during transport by robot arm 80 and parked in a common location in the micro environment system, thereby keeping contaminants sandwiched therebetween to minimize their deleterious effects on the micro environment system.

Load lock chamber door 40 and pod door 38 are provided with vacuum gripping surfaces 57' and 57, respectively, which enable gripper tool 60 to grasp the doors using vacuum action during the removal and replacement operations. A corresponding vacuum pad 112 is provided on gripper tool 60. Alternatively, the grasping function may be provided by the mechanical mating of keys 52 with lock sockets 51 and 54 such that when the keys 52 are actuated to effect retraction of latches 50 or 53, relative displacement of gripper 60 with respect to the doors 40 or 38 is mechanically precluded by a suitable retention mechanism (not shown). A combination of the vacuum action and the mechanical mating may also be used, so long as the doors 38 and 40 remain coupled to gripper tool 60 during transport to and from their respective parking positions.

FIG. 11 shows an arrangement in accordance with the invention following removal of load lock chamber door 40 and pod door 38 corresponding to pod 81". Load lock chamber door 40, pod door 38, and gripper tool 60 are shown in respective parking positions within the system micro environment. Robot arm 80, after shedding gripper tool 60, is shown operating with a paddle 66 which is mounted to a distal end thereof in lieu of gripper tool 60. Paddle 66 may be used to transfer the contents of the pods 81–84, 81'–84', and 81"–84" to and from processing stations 75–77 or to effect other handling procedures as appropriate. At the parking position, pod doors 38 and load lock chamber doors 40 are stacked in suitable configurations to conserve space as shown in the exemplary arrangement of FIG. 12. Also at the parking positions, particular accommodations may be made to hold or retain the doors, stacked or individually, in place, along with the tools, such as end gripper 60 or paddle 66, which are not being used by the robot at a particular time. Alternatively, the doors may be parked in designated ports.

When processing is complete, the substrates, which may be semiconductor wafers (not shown), are returned to the pods or other suitable carriers outside the load lock chamber, and the procedure above is reversed. Specifically, gripper tool 60 is re-mounted by the robot 78 onto arm 80 thereof, and pod doors 38 and load lock chamber doors 40 are retrieved from their respective parking positions for re-closing of the pods and load lock chamber ports. This procedure is also automated and takes places within the confines of the micro environment of the system 71, and preferably within load lock chamber 73 (see FIG. 1).

The dual function of the robot arm 80—namely, the function of opening and closing pod and load lock chamber doors with gripper tool 60 and the function of handling the substrates with for example paddle 66—provides obvious advantages over the prior art per the above discussion. In order to effect the dual function, several modes of operation are contemplated.

In one embodiment in accordance with the invention, arm 80 of the robot 78 is equipped with an end effector 58 as shown in FIG. 13. End effector 58 is provided with a motor 59 and a mounting plate 65 having disposed thereon sockets 67, 68 and 69. Each socket is designed to mate with a unit interface provided on one of a variety of tools available for use by the robot 78. These tools include for example a wafer handling paddle 66 having unit interface 84, a gripper tool 60 having unit interface 64 and a scanner 72 having unit interface 85. The unit interfaces 84, 64 and 85 are designed to rigidly mount the associated component into the end effector 58 and to complete any electrical, pneumatic or mechanical connections between the associated component and the end effector 58 to thereby permit communication with and control by the robot 78. Sockets 67, 68 and 69 are identical, as are the unit interfaces 84, 64 and 85, such that any tool 66, 60 and 72 can fit in any socket 67, 68 and 69. Coupling, decoupling and interchanging of the tools such as paddle 66, gripper tool 60 and scanner 72 is effected automatically by the robot within the system micro environment, thereby significantly streamlining the substrate handling process. The array of tools is preferably disposed in a designated parking region in the system micro environment, and preferably within the load lock chamber, to facilitate self-attachment and detachment by the robot arm 80.

The details of the coupling mechanism in accordance with a first embodiment of the invention can best be appreciated with reference to FIG. 16 wherein details of socket 69 and unit interface 64 of gripper tool 60 are shown. Socket 69 comprises a socket body 86 rigidly mounted on robot arm 80 (not shown in FIG. 16). A sealed actuator comprising self-contained bellows biasing member 90 is sealed against inside surface 89 of socket 69 and is in gas (which may be air) communication with pneumatic line 91 adapted to pressurize biasing member 90 to cause expansion thereof and exertion of a force thereby against unit interface 64, disposed in mounting portion 62 of gripper tool 60. A contact pad 92 is disposed between the biasing member 90 and unit interface 64 and may be mounted on either component. The sealed actuator may also take the form of a sealed mechanical device adapted to extend towards unit interface 64 by action of for example a cam mechanism or a slotted wheel (not shown), as long as the these components are isolated, by virtue of the sealing action of an expedient such as an expansible bellows, from the controlled micro environment to prevent contamination thereof by particles released during motion of the mechanical components and/or lubricants.

Socket body 86 is also provided with electrical, vacuum and pressure lines shown collectively as 93. Some or all of these lines, depending on the tool being coupled to the end effector, have counterparts on the tool with which they complete a connection. For gripper tool 60, for example, only the electrical lines need to complete the connection, via connector pins 94 on socket 69 and openings 95 on tool 60. It is contemplated that means for actuating the unlatching of the doors 38 and 40 may be other than the motor 55, in which case rather than an electrical connection to the motor 55, a mechanical connection such as a shaft and/or clutch mechanism (not shown) may be implemented between arm 80 and gripper tool 60 via socket 69. Coupling is facilitated by main guiding surfaces 96 and 97 and a guide pin 98 with corresponding hole 99. A position sensor 100 to insure secure mating is provided.

Although fixed during normal operations, end effector 58 itself is an interchangeable component and may be replaced by other end effectors having different configurations, such as a different number and arrangement of sockets. Four such arrangements are shown in FIGS. 14A–14D, respectively showing single- (58'), double- (58"), triple- (58) and quadruple-socket arrangements (58''') for mounting as many tools.

In an alternative embodiment in accordance with the invention and shown schematically in FIG. 15, the end effector 74 may be designed to accommodate a combination of fixed components, such as paddle 66' and scanner 72', and interchangeable components such as gripper tool 60. Socket 69' is provided on end effector 74 to facilitate coupling with the interchangeable component. Those skilled in the art will recognize that many such combinations are possible and are dictated by the particular system design and requirements. Space, weight and other considerations would factor into the specific design selected.

FIGS. 17–18 show a system in accordance with the invention in which the end effector itself is interchangeable by the robot 78 within the micro environment. Specifically, FIGS. 17A and 17B show a socket 101 mounted at a distal end of robot arm 80 of robot 78. The socket 101 is adapted to receive end effector 87 for mating therewith, with the end effector 87 having its own motor 88 and, in the exemplary arrangement illustrated, a substrate handling tool 66". End effector 87, shown in more detail in FIG. 18, is provided with mounting portion 102 having interface unit 103 for coupling with socket 101 in the manner described above. Connections for motor 88 and for other electrical or pneumatic mechanisms (not shown) are thus achieved.

Although the above-described embodiment relies on the sealed actuator to achieve the mechanical coupling between the detachable components, in the preferred embodiment this coupling is implemented using vacuum action in accordance with the arrangement described in FIGS. 19–21. Specifically, FIGS. 19 and 20 show a socket 110 comprising a socket body 112 rigidly supported in robot arm 80. Socket body 112 contains therein a chamber 114 across a section of which extends movable membrane 116, thereby partitioning the chamber 114 into two regions, 111 and 113. Membrane 116 thus at least partially forms a boundary of chamber 113. Socket body 112, for assembly and/or maintenance purposes, may be constructed of two separate portions (separated at dashed line 115) fitted together and having membrane 116 secured therebetween. A piston 120 is movably mounted in socket body 112 and is attached to movable membrane 116. Piston 120 is provided with a locking spring 122 to urge the piston 120 in the direction of arrow e in the drawing figure, towards the detachable tool, for example gripper tool 60. Socket body 112 is provided with laterally expanding member 124, which is comprised of locking balls 126 engaging inclined top surface 121 of piston 120.

Operation of the arrangement of FIG. 19 is such that when unit interface 64 of gripper tool 60 is disposed as shown in the drawing figure relative to socket 110, locking spring 122 drives piston 120 towards expanding member 124. Inclined surface 121 of piston 120 engages locking balls 126 of expanding member 124, causing expanding member 124 to expand laterally. This lateral expansion takes place in region 128 and against lip portions 130 of unit interface 64 of gripper tool 60 (see FIG. 20) and operates to lock gripper tool 60 in position against socket 110. To release gripper tool 60, region 113 of chamber 114 is at least partially evacuated via conduit 118, using appropriately applied vacuum action from a vacuum source (not shown). Evacuation of region 113 causes motion of movable member 116, along with attached piston 120, in the direction of arrow d, thereby loading spring 122. Motion of piston 120 permits lateral contraction of expanding member 124 and disengagement from region 128 of unit interface 64, and ensuing release of gripper tool 60 from socket 110. It should be noted that this arrangement ensures that the default position, in case of loss of vacuum power, is expansion of expanding member 124 and engagement of region 128 to thereby lock gripper tool 60 in place.

To improve alignment of the components, guide pins 132, preferably provided on unit interface 64 of gripper tool 60, mate with bushings 134 provided in socket body 112. Springs 136 may be used to provide biasing of bushings 134 within socket body 112. (See FIG. 21) Also, appropriate electrical and pneumatic connections 138, 138', 140, 140' may be accommodated in the manner described above, along with clutch motion (not shown) which may also be provided between the components. A sensor 142 is provided to ensure proper relative positioning of the components. An advantage of the above-described arrangement is that there is no introduction of air/gas into the micro environment system using this arrangement, thus reducing the risk of contamination.

It is to be understood that although the invention is discussed with respect to semiconductor wafers, other substrates, such as flat panel displays, reticles, etc. may be handled by a system in accordance therewith. Additionally, the system of the invention may be practiced with semiconductor wafers of different sizes, such as 200 and 300 mm diameter wafers. Thus the above are exemplary modes of carrying out the invention and are not intended to be limiting. Those skilled in the art will appreciate that modifications to the invention can be made without departure from the spirit and scope thereof as set forth in the following claims.

What is claimed is:

1. A substrate handling system adapted to transport a substrate between a first position and a second position, the substrate when in the first position being disposed within a pod having a removable pod door, the second position being within a micro environment, the substrate handling system comprising:

a load lock chamber having a port for allowing access to the pod in an engagement position and having a removable load lock chamber door for closing the port; and a robot having an articulating arm comprised of a plurality of links including a proximal link and one or more distal links, wherein at least one of said distal links is provided with at least two degrees of freedom and is configured to support a first tool for removing the load lock chamber door and the pod door to a location within the load lock chamber which is remote from the port, and a second tool for transporting the substrate between the first position and the second position, wherein said first and second tools are supported by said one of said distal links so as to have at least two degrees of freedom.

2. The of claim 1, wherein the robot arm is provided with kinematically redundant motion.

3. The system of claim 1, wherein the arm is capable of R- and θ-motion in a cylindrical coordinate system.

4. The system of claim 3, wherein the arm is capable of Z-motion in the cylindrical coordinate system.

5. The system of claim 4, wherein the arm is mounted for translation along a translation axis which is offset from parallelism with a Z axis defining the Z motion by an angle α, said angle α having a predetermined and controllable value.

6. The system of claim 5, wherein the arm is capable of yaw motion.

7. The system of claim 6, wherein the arm is capable of roll motion.

8. The substrate handling system of claim 1, wherein the load lock chamber and the second position comprise regions in a micro environment system.

9. The substrate handling system of claim 8, wherein the substrates are semiconductor wafers, and wherein the micro environment comprises a semiconductor wafer processing environment.

10. The substrate handling system of claim 8, wherein the substrates are flat panel displays, and wherein the micro environment comprises a flat panel display processing environment.

11. The substrate handling system of claim 8, wherein the substrates are reticles, and wherein the micro environment comprises a reticle processing environment.

12. The system of claim 8, further comprising a parking location associated with each of the load lock chamber doors and the pod doors, the parking locations supporting the associated doors within the micro environment system.

13. The substrate handling system of claim 12, wherein the arm is adapted for motion in a cylindrical coordinate system defining Z-, R- and θ-coordinates and wherein the parking location of the pod door and the engagement position of the pod door are different and the parking location of the load lock chamber door and the engagement position of the load lock chamber door are different, the differences being in at least the θ-coordinate of the cylindrical coordinate system.

14. The system of claim 1, wherein the robot arm is provided with an end effector having supported therein a gripper tool for handling the pod door and the load lock chamber door.

15. The system of claim 14, wherein the pod door and the load lock chamber door are each provided with a corresponding latch, the pod door latch removably securing the pod door to the pod and the load lock chamber door latch removably securing the load lock chamber door in the load lock chamber port, the latches being mechanically linked to associated lock sockets for retraction thereby, the gripper tool actuating retraction of the latches through the associated lock sockets.

16. The system of claim 15, further comprising a parking location associated with each of the load lock chamber doors and the pod doors, the parking locations supporting the associated doors within the micro environment, the gripper tool being adapted to grip the doors during transport to the respective parking locations, the gripping being effected by vacuum action.

17. The system of claim 15, further comprising a parking location associated with each of the load lock chamber doors and the pod doors, the parking locations supporting the associated doors within the micro environment, the gripper tool being adapted to grip the doors during transport to the respective parking locations, the gripping being effected by a retention mechanism which prevents relative gripper tool-door displacement during latch actuation by the gripper tool.

18. The system of claim 14, wherein the gripper tool is detachably supported in the end effector and comprises one of a plurality of tools adapted to be detachably supported by the end effector.

19. The method of claim 18, wherein the end effector is provided with one or more sockets each coupling the end effector to one of the plurality of tools, the socket effecting connection of one or more vacuum, pressure, mechanical linkage and electrical lines between the tool and the robot.

20. The system of claim 19, wherein each socket is provided with a position sensor for indicating proper coupling between the socket and the tool.

21. The system of claim 19, wherein each socket comprises a biasing member adapted to retain the tool in the socket.

22. The system of claim 21, wherein the biasing member comprises a self-contained bellows adapted to receive gas therein and thereby expand towards the tool.

23. The system of claim 19, wherein each socket comprises a movably mounted vacuum actuated piston.

24. The system of claim 23, wherein the piston defaults to an engagement position in which the tool is rigidly attached to the socket in the absence of a vacuum.

25. The system of claim 18, wherein each tool of the plurality of tools is provided with a tool parking position within the load lock chamber.

26. The system of claim 1, wherein the robot arm is adapted to simultaneously transport the pod door and the load lock door to and from a parking location within the micro environment.

27. The system of claim 1, wherein the load lock chamber is adapted to engage a plurality of pods arranged in one or more columns.

28. The system of claim 1, further comprising a latching mechanism for urging the pod to the engagement position.

* * * * *